United States Patent
Ha

(10) Patent No.: US 9,564,586 B2
(45) Date of Patent: Feb. 7, 2017

(54) ELECTRONIC DEVICE AND OPERATION METHOD THEREOF

(71) Applicant: SK hynix Inc., Icheon (KR)

(72) Inventor: Tae-Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 14 days.

(21) Appl. No.: 14/807,599

(22) Filed: Jul. 23, 2015

(65) Prior Publication Data

US 2016/0329491 A1 Nov. 10, 2016

(30) Foreign Application Priority Data

May 6, 2015 (KR) ........................ 10-2015-0062978

(51) Int. Cl.
| | |
|---|---|
| G11C 11/24 | (2006.01) |
| H01L 45/00 | (2006.01) |
| G11C 13/00 | (2006.01) |
| G06F 3/06 | (2006.01) |
| G06F 12/08 | (2016.01) |
| G06F 13/40 | (2006.01) |
| H01L 27/24 | (2006.01) |
| H01L 35/28 | (2006.01) |

(52) U.S. Cl.
CPC ......... *H01L 45/1286* (2013.01); *G06F 3/0604* (2013.01); *G06F 3/0629* (2013.01); *G06F 3/0679* (2013.01); *G06F 12/0802* (2013.01); *G06F 13/4068* (2013.01); *G11C 13/0023* (2013.01); *G11C 13/0097* (2013.01); *H01L 27/2418* (2013.01); *H01L 27/2427* (2013.01); *H01L 27/2463* (2013.01); *H01L 35/28* (2013.01); *H01L 45/1233* (2013.01); *H01L 45/1253* (2013.01); *H01L 45/1293* (2013.01); *G06F 2212/2024* (2013.01); *G06F 2212/60* (2013.01)

(58) Field of Classification Search
CPC ... G11C 13/0069; G11C 5/02; G11C 13/0002; G11C 2213/76
See application file for complete search history.

(56) References Cited

U.S. PATENT DOCUMENTS

| | | | | |
|---|---|---|---|---|
| 7,170,777 B2 * | 1/2007 | Choi | ........................ | G11C 8/08 365/163 |
| 7,208,751 B2 * | 4/2007 | Ooishi | ..................... | G11C 5/02 365/182 |
| 7,259,387 B2 * | 8/2007 | Kawazoe | ........... | G11C 13/0007 365/148 |

(Continued)

*Primary Examiner* — Tuan T Nguyen

(57) ABSTRACT

Provided is an electronic device including a semiconductor memory. The semiconductor memory may include: a plurality of first lines extending in a first direction and arranged in parallel to each other; a plurality of second lines extending in a second direction crossing the plurality of first lines and arranged in parallel to each other; and a plurality of memory cells disposed in intersection regions of the plurality of first lines and the plurality of second lines, respectively, and wherein each of the memory cells may include: a selecting element including a switching element and a thermoelectric element that are coupled to each other, the switching element having a non-linear current-voltage characteristic; a variable resistance element coupled to the selecting element; and a heat insulating member surrounding at least a sidewall of the selecting element.

14 Claims, 10 Drawing Sheets

(56) References Cited

U.S. PATENT DOCUMENTS

| | | | |
|---|---|---|---|
| 7,755,934 B2* | 7/2010 | Toda | G11C 8/08 365/131 |
| 7,800,935 B2* | 9/2010 | Maejima | G11C 11/56 365/148 |
| 8,395,926 B2* | 3/2013 | Kreupl | G11C 11/16 365/148 |
| 8,520,425 B2* | 8/2013 | Xiao | G11C 13/0007 365/148 |
| 8,552,412 B2* | 10/2013 | Park | H01L 45/06 257/4 |
| 8,724,369 B2* | 5/2014 | Zhang | H01L 45/08 365/148 |
| 8,830,740 B2* | 9/2014 | Sasago | G11C 13/0004 365/148 |
| 9,025,369 B2* | 5/2015 | Takashima | H01L 27/2436 365/148 |
| 2013/0187113 A1 | 7/2013 | Martens et al. | |

* cited by examiner

ELECTRONIC DEVICE AND OPERATION METHOD THEREOF

CROSS-REFERENCE TO RELATED APPLICATIONS

The present document claims priority of Korean Patent Application No. 10-2015-0062978, and filed on May 6, 2015, which is incorporated herein by reference in its entirety.

BACKGROUND

This patent document relates to memory circuits or devices and their applications in electronic devices or systems.

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a memory device having a cross-point architecture and capable of reducing a sneak current.

In an implementation, there is provided an electronic device including a semiconductor memory. The semiconductor memory may include: a plurality of first lines extending in a first direction and arranged in parallel to each other; a plurality of second lines extending in a second direction crossing the plurality of first lines and arranged in parallel to each other; and a plurality of memory cells disposed in intersection regions of the plurality of first lines and the plurality of second lines, respectively, and wherein each of the memory cells may include: a selecting element including a switching element and a thermoelectric element that are coupled to each other, the switching element having a non-linear current-voltage characteristic; a variable resistance element coupled to the selecting element; and a heat insulating member surrounding at least a sidewall of the selecting element.

The switching element may include one selected from a MIT (Metal Insulator Transition) element, a MIEC (Mixed Ion-Electron Conducting) element, an OTS (Ovonic Threshold Switching) element, and a combination thereof. The thermoelectric element may include a first material layer coupled to one terminal of the switching element and having a first work function; and a second material layer coupled to the other terminal of the switching element and having a second work function smaller than the first work function. The first and second material layers may have complementary conductive types. The first work function may have a value corresponding to a work function of P-type polysilicon, and the second work function may have a value corresponding to a work function of N-type polysilicon. The first and second material layers may include a semiconductor material or a metallic material. The heat insulating member may include a material having an insulating property. The heat insulating member may include one selected from a porous material, aerogel, zeolite, Low temp oxide, and a combination thereof. The variable resistance element may include one selected from a ferromagnetic material, a metal oxide material, a phase-change material, a ferrodielectric material, and a combination thereof.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, an operation method of an electronic device including a semiconductor memory having a cross-point architecture, the operation method may include: driving, using four or more driving voltages having different magnitudes, first lines and second lines, which cross each other and are coupled to a plurality of memory cells, so that a direction of a current passing through a selected cell among the plurality of memory cells, a direction of a current passing through a first unselected cell sharing a first line with the selected cell, and a direction of a current passing through a second unselected cell sharing a second line with the selected cell are to be same, and driving, using the four or more driving voltages, the first and second lines so that a direction of a current passing through a third unselected cell which does not share the first and second lines with the selected cell is to be opposite to the direction of the current passing through the selected cell.

The driving voltages may include first to fourth driving voltages. The first driving voltage may be a ground voltage, the second driving voltage may have a magnitude corresponding to ⅓ of a magnitude of the fourth driving voltage, and the third driving voltage may have a magnitude corresponding to ⅔ of the magnitude of the fourth driving voltage. In a set operation of the semiconductor memory, the fourth driving voltage may be applied to the first line coupled to the selected cell, the first driving voltage may be applied to the second line coupled to the selected cell, the second driving voltage may be applied to a first line which is not coupled to the selected cell, and the third driving voltage may be applied to a second line which is not coupled to the selected cell. In a reset operation of the semiconductor memory, the first driving voltage may be applied to the first line coupled to the selected cell, the fourth driving voltage may be applied to the second line coupled to the selected cell, the third driving voltage may be applied to a first line which is not coupled to the selected cell, and the second driving voltage may be applied to a second line which is not coupled to the selected cell.

Each of the memory cells may include: a selecting element including a switching element and a thermoelectric element that are coupled to each other, the switching element having a non-linear current-voltage characteristic; a variable resistance element coupled to the selecting element; and an heat insulating member surrounding at least a sidewall of the selecting element, wherein the thermoelectric element includes a first material layer and a second material layer, the first material layer being interposed between a second line and the switching element and having a first work function, the second material layer being interposed between a first line and the switching element and having a second work function smaller than the first work function, and wherein the selecting element is thermoelectrically cooled when a current flows from the first line to the second line, and thermoelectrically heated when a current flows from the second line to the first line.

DETAILED DESCRIPTION

Figure 1:
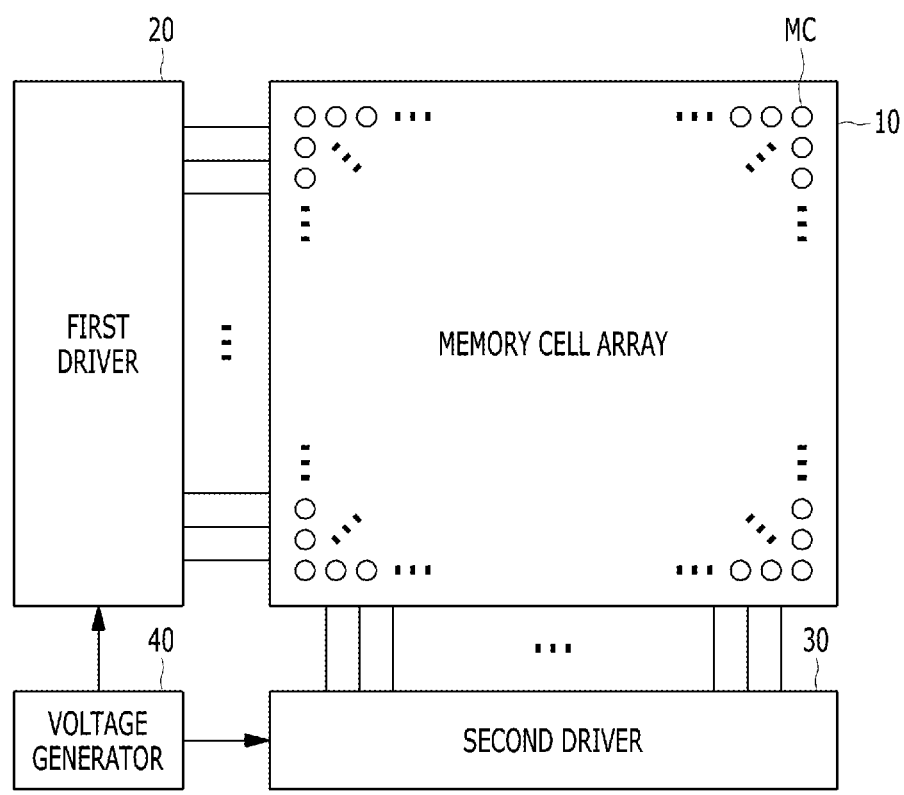
FIG. 1 illustrates a memory device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations relate to an electronic device including a selecting element capable of substantially preventing the occurrence of a sneak current in a memory device having a cross-point architecture in which memory cells are positioned in intersection regions of lines crossing each other, and an operation method thereof.

Figure 2:
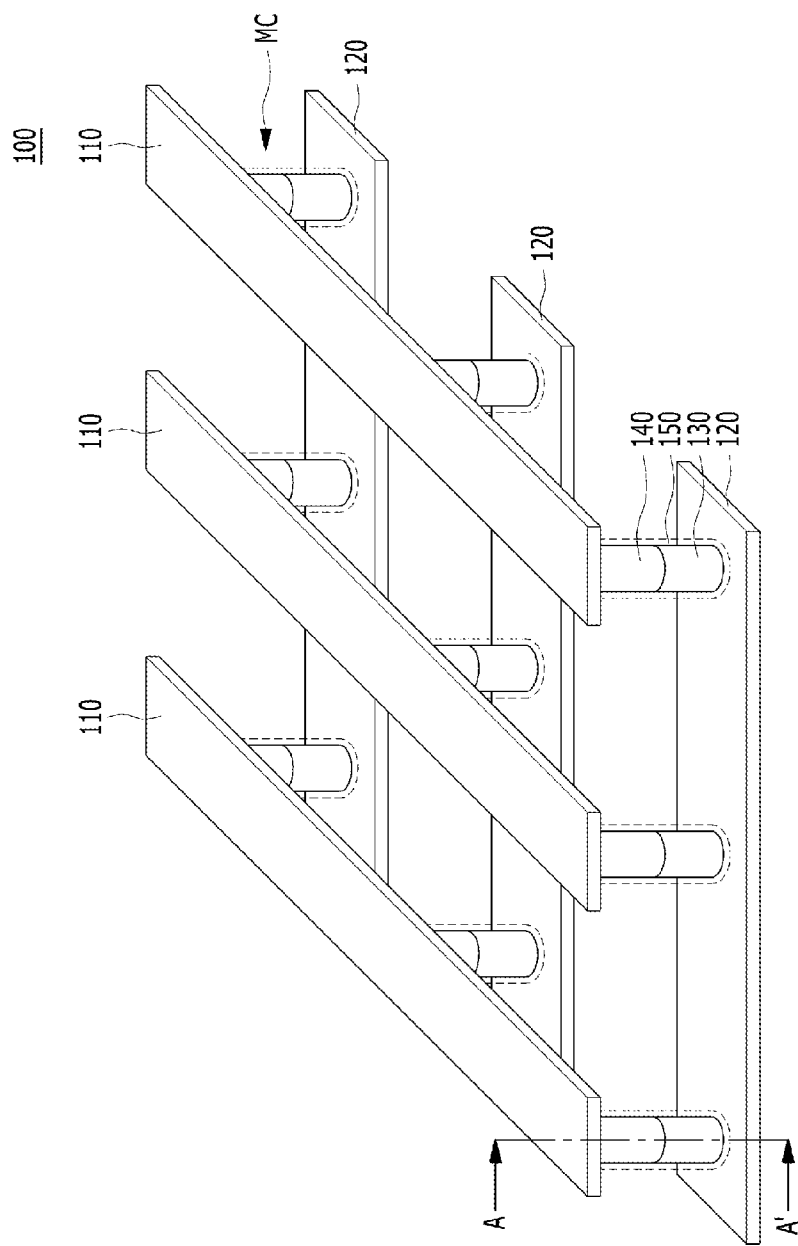
FIG. 2 is a perspective view illustrating a memory cell array in a memory device in accordance with an implementation.
Figure 3:
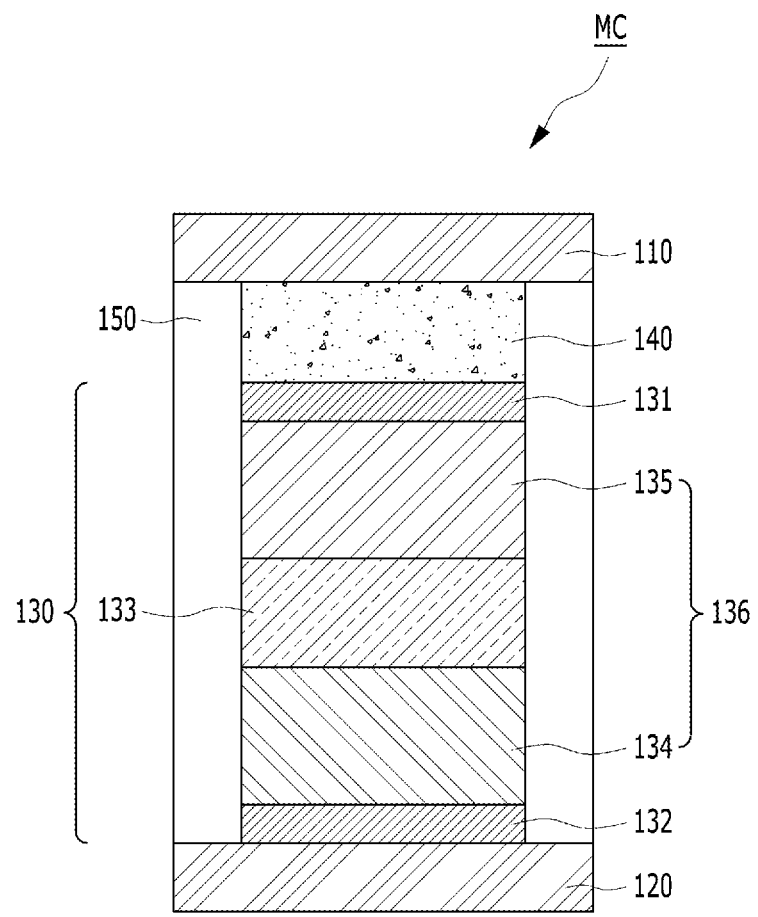
FIG. 3 is a cross-sectional view of a memory cell, taken along line A-A' of FIG. 2.
Figure 4:
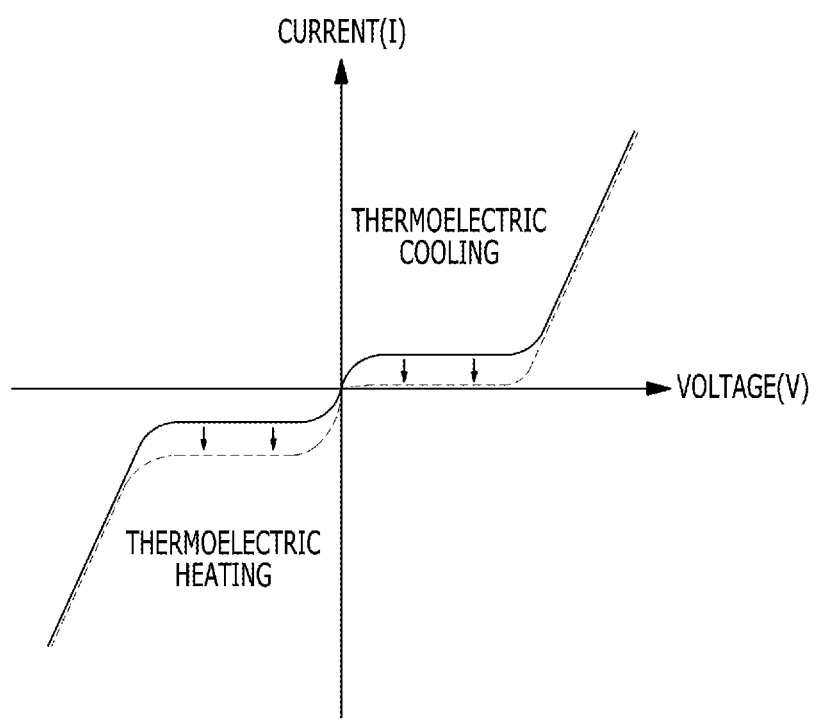
FIG. 4 is a graph illustrating a current-voltage characteristic of a selecting element in a memory device in accordance with an implementation.

FIG. 1 illustrates a memory device in accordance with an implementation. FIG. 2 is a perspective view illustrating a memory cell array in a memory device in accordance with an implementation. FIG. 3 is a cross-sectional view of a memory cell, taken along a line A-A' of FIG. 2. FIG. 4 is a graph illustrating a current-voltage characteristic of a selecting element in a memory device in accordance with an implementation.

Referring to FIG. 1, the memory device in accordance with the implementation may include a memory cell array 10 having a cross-point architecture, a first driver 20, a second driver 30, and a voltage generator 40. The first driver 20 may drive first lines extending in a row direction with respect to the orientation of FIG. 1 among a plurality of lines crossing each other in the memory cell array 10. The second driver 30 may drive second lines extending in a column direction with respect to the orientation of FIG. 1 among the plurality of lines crossing each other. The voltage generator 40 may provide predetermined driving voltages to the first and second drivers 20 and 30.

The first and second drivers 20 and 30 may be referred to as a row driver and a column driver, respectively. The first and second drivers 20 and 30 may receive driving voltages from the voltage generator 40, and drive the first and second lines of the memory cell array 10, respectively.

The voltage generator 40 may provide four or more driving voltages having different magnitudes to the first and second drivers 20 and 30. In an implementation, the voltage generator 40 may generate first to fourth driving voltages. The first driving voltage may be set to a ground voltage, and the second and third driving voltages may have magnitudes corresponding to ⅓ and ⅔ of a magnitude of the fourth driving voltage, respectively. For example, when the fourth driving voltage is 3V, the second and third driving voltages may be set to 1V and 2V, respectively, and the first driving voltage may be set to 0V. The first to fourth driving voltages provided to the first and second drivers 20 and 30 from the voltage generator 40 may control directions of currents passing through a plurality of memory cells MC, and prevent the occurrence of a sneak current in the memory device having the cross-point architecture.

Referring to FIGS. 2 and 3, a memory cell array 100 of a memory device in accordance with an implementation may include a plurality of first lines 110, a plurality of second lines 120, and a plurality of memory cells MC. The plurality of first lines 110 may extend in a first direction and be arranged in parallel to each other. The plurality of second lines 120 may extend in a second direction to cross the plurality of first lines 110 and be arranged in parallel to each other. The plurality of memory cells MC may be arranged at intersections of the plurality of first lines 110 and the plurality of second lines 120. Each of the memory cells MC may include a variable resistance element 140, a selecting element 130 coupled to the variable resistance element 140, and an heat insulating member 150 surrounding at least a sidewall of the selecting element 130.

The first lines 110 may extend in a row direction, and be referred to as row lines or word lines. The second lines 120 may extend in a column direction, and be referred to as column lines or bit lines. The first and second lines 110 and 120 may serve to supply a voltage or current across a memory cell MC. Each of the first and second lines 110 and 120 may have a single-layer or multi-layer structure including a metal or metal nitride. The metal may include Pt, Ir, Ru, Al, Cu, W, Ti, Ta, Co, Ni, or the like, and the metal nitride may include TiN, TiCN, TiAlN, TiON, TaN, TaCN, TaAlN, TaON, WN, MoN, or the like.

The variable resistance element 140 may switch between different resistance states according to a voltage or current supplied thereto through the first and second lines 110 and 120, and have a single-layer or multi-layer structure. The variable resistance element 140 may include at least one of various materials used for RRAM, PRAM, FRAM, MRAM, STTRAM and the like. The various materials may include a transition metal oxide material, a metal oxide such as a perovskite-based material, a phase change material such as a chalcogenide-based material, a ferrodielectric material, and a ferromagnetic material.

Referring to FIG. 3, the selecting element 130 may include a switching element 133 and a thermoelectric element 136, which are inserted between first and second electrodes 131 and 132 and electrically and thermally coupled to each other.

The switching element 133 may have a non-linear current-voltage characteristic. In an implementation, the switching element 133 may include a MIT (Metal Insulator Transition) element such as $NbO_2$ or $TIO_2$. In other implementations, the switching element 133 may include a MIEC (Mixed Ion-Electron Conducting) element such as $ZrO_2$ $(Y_2O_3)$, $Bi_2O_3$—BaO, or $(La_2O_3)x(CeO_2)1$-x, or an OTS (Ovonic Threshold Switching) element such as a chalcogenide-based material.

The thermoelectric element 136 may thermoelectrically cool or heat the selecting element 130 according to a direction of a current passing through the selecting element 130, based on the Peltier effect that is the presence of heating or cooling at an electrified junction of two different conductors. The Peltier effect is due to a temperature difference created by applying a voltage or current to the first and second electrodes 131 and 132. In an implementation, the thermoelectric element 136 may include a first material layer 134 and a second material layer 135. The first material layer 134 may be interposed between the switching element 133 and the second electrode 132 and have a first work function. The second material layer 135 may be interposed between the switching element 133 and the first electrode 131 and have a second work function smaller than the first work function. Due to a difference between the work functions, the first and second material layers 134 and 135 may have complementary conductive types. In an implementation, the first work function may have a value corresponding to a work function of P-type polysilicon, and the second work function may have a value corresponding to a work function of N-type polysilicon. In an implementation, the first work function may be equal to or greater than 4.7eV, and the second work function may be equal to or smaller than 4.1eV. Each of the first and second material layers 134 and 135 may include a semiconductor material or a metallic material, which satisfies the work function condition, and have a single-layer or multi-layer structure. For example, the first material layer 134 may be formed of P-type polysilicon, and the second material layer 135 may be formed of N-type polysilicon.

The selecting element 130 may control a non-linear current-voltage characteristic of the switching element 133 using the thermoelectric element 136. During thermoelectric cooling, the change in an off current of the switching element 133, that is, the change in a resistance value of the switching element 133 in an off state, may be larger than that of the switching element 133 during thermoelectric heating. Thus, it is possible to substantially prevent the occurrence of a sneak current in the memory cell array 100. This configuration will be described in detail with reference to FIG. 4.

In FIG. 4, a solid line is a graph illustrating a current-voltage characteristic of an existing switching element, and a dotted line is a graph illustrating a current-voltage characteristic of the selecting element 130 including the switching element 133 and the thermoelectric element 136 which are electrically and thermally coupled to each other.

Referring to FIG. 4, the switching element 133 may pass almost no current when a magnitude of a voltage applied to the switching element 133 is equal to or less than a predetermined threshold value (that is, the switching element 133 is in an off state). On the other hand, the switching element 133 may pass a bidirectional current which gradually increases in proportion to the magnitude of the voltage when the magnitude of the voltage exceeds the predetermined threshold value.

When a positive voltage and a negative voltage have the same magnitude, in the existing switching element, magnitudes of currents passing in both directions may be substantially equal to each other. That is, the bidirectional current may be substantially symmetrical with each other.

A sneak current may be affected when the magnitude of the voltage applied to the switching element 133 is equal to or less than the threshold value, or affected by the off current. As the off current of the switching element 133 increases, the sneak current may also increase. In particular, the sneak current may be significantly affected by an off current which occurs in a region to which a positive voltage is applied.

The selecting element 130 in accordance with the implementation may reduce the off current through thermoelectric cooling when a voltage is applied to the selecting element 130 such that a current flows into the first material layer 134 through the switching element 133 from the region to which the positive voltage is applied, for example, the second material layer 135. This operation can substantially prevent the occurrence of a sneak current.

On the other hand, when a voltage is applied to the selecting element 130 such that a current flows into the second material layer 135 through the switching element 133 from a region to which a negative voltage is applied, for example, the first material layer 134, the selecting element 130 may increase the off current through thermoelectric heating. However, since a sneak current path in the memory cell array 100 having the cross-point architecture is formed through a memory cell MC including a thermoelectrically cooled selecting element 130 (refer to FIGS. 5 and 6), the occurrence of a sneak current can be substantially prevented. Specifically, since the memory cell MC including the thermoelectrically cooled selecting element 130 has a large resistance value at a low off current, that is, in an off state, the entire resistance value of the sneak current path may be increased to prevent the occurrence of the sneak current.

The heat insulating member 150 may have a shape of surrounding a sidewall of the selecting element 130 or a shape of surrounding both sidewalls of the selecting element 130 and the variable resistance element 140, that is, surrounding a sidewall of the memory cell MC. The heat insulating member 150 may include a material having an insulating property. In some implementations, the heat insulating member 150 may include any one selected from porous materials, aerogel, zeolite, Low temp oxide, and a combination thereof.

The heat insulating member 150 may serve to improve a temperature change in the thermoelectric element 136 of the selecting element 130, that is, to improve thermoelectric conversion efficiency. For reference, since the thermoelectric conversion efficiency of the thermoelectric element 136 is proportional to the thickness of the material layers forming the thermoelectric element 136, that is, the thickness of the first and second material layers 134 and 135, a highly-integrated structure such as a memory device may have difficulties in obtaining satisfactory thermoelectric conversion efficiency. Thus, as the heat insulating member 150 surrounding at least the sidewall of the selecting element 130 is provided in the present implementation, the heat insulating member 150 may conserve even a minute temperature change in the thermoelectric element 136, thereby improving the thermoelectric conversion efficiency. Thus, it is possible to more effectively prevent the occurrence of a sneak current in the memory cell array 100.

As the memory device includes the selecting element 130 in which the switching element 133 having a non-linear current-voltage characteristic and the thermoelectric element 136 are coupled to each other, the memory device can substantially prevent the occurrence of a sneak current in the memory cell array 100 having the cross-point architecture. This will be described in more detail with reference to FIGS. 5 and 6.

Figure 5:
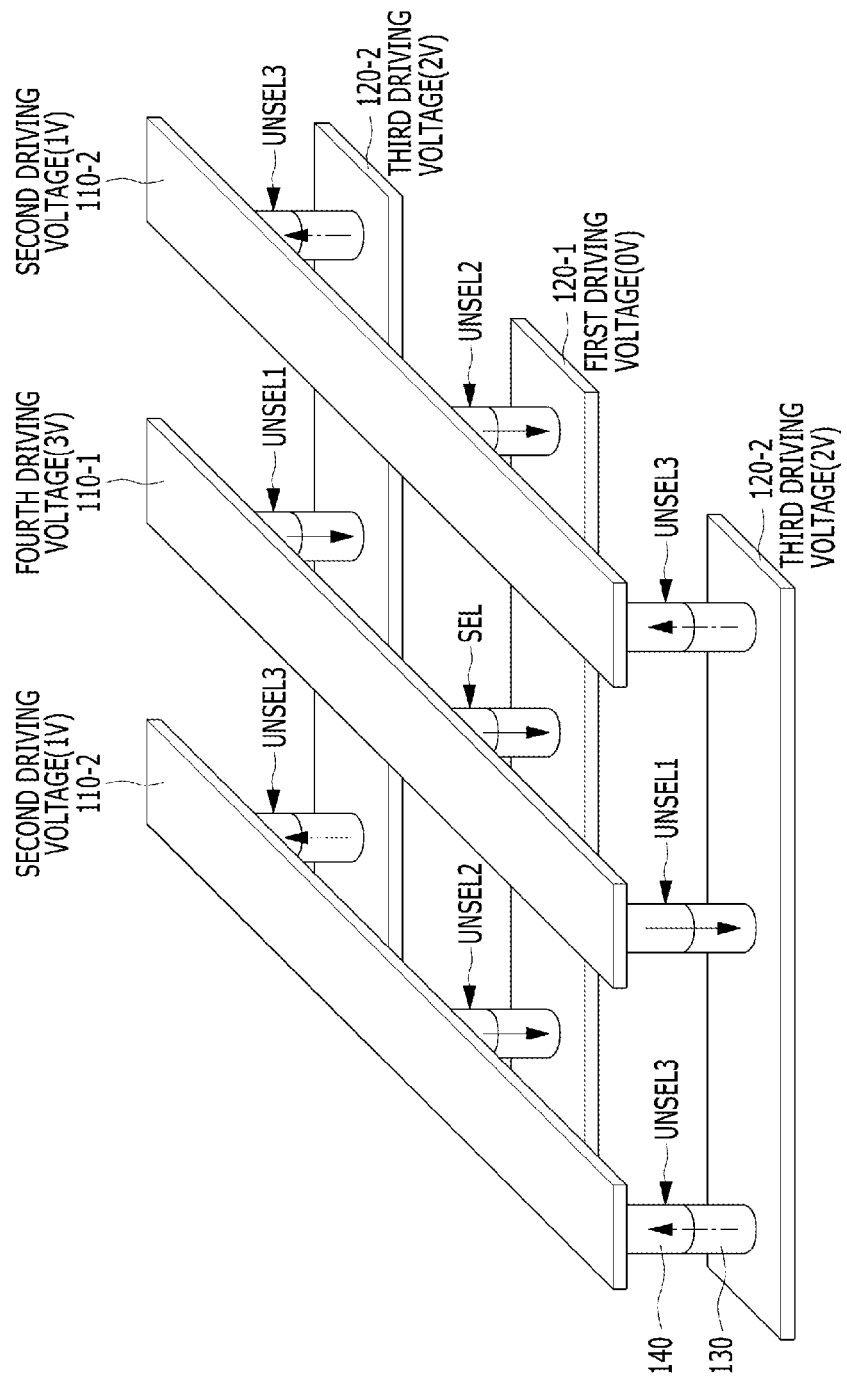
FIG. 5 is a diagram for describing a set operation in accordance with an implementation.
Figure 6:
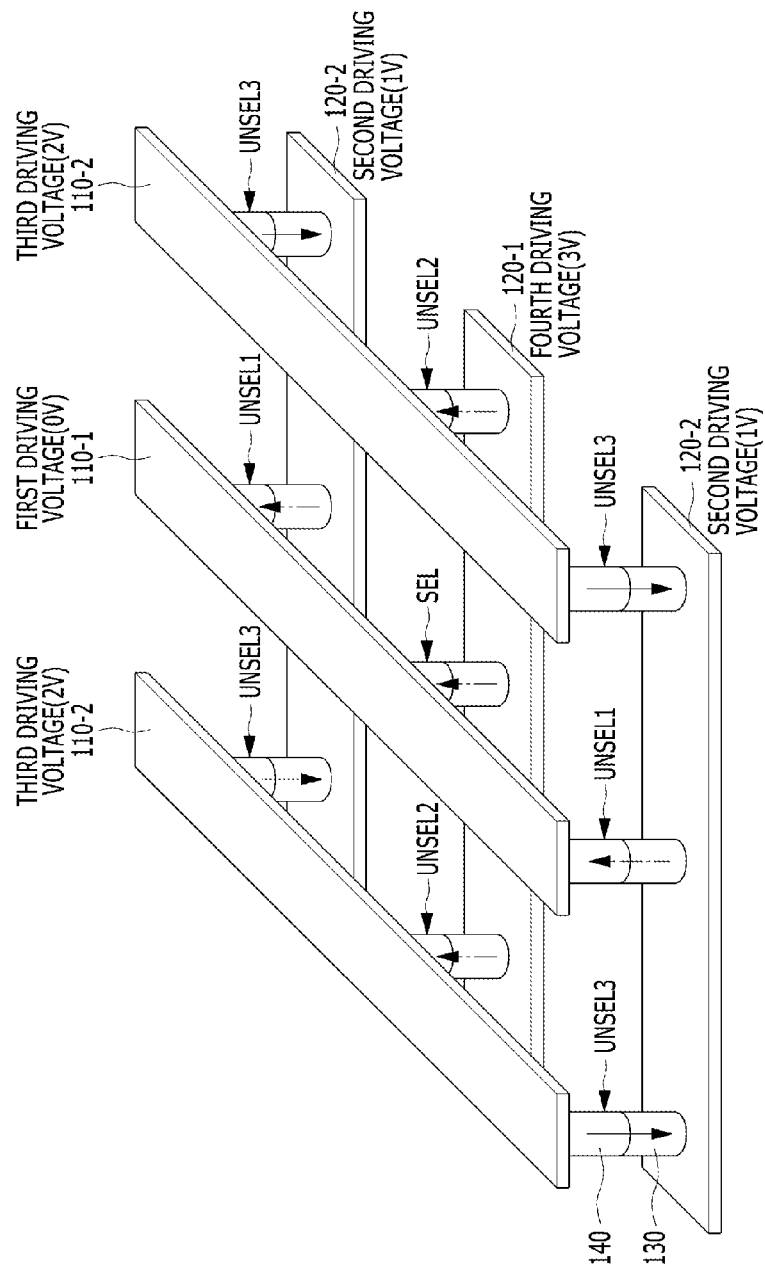
FIG. 6 is a diagram for describing a reset operation in accordance with an implementation.

FIGS. 5 and 6 are diagrams for describing operations of a memory device in accordance with implementations. FIG. 5 is a diagram for describing a set operation, and FIG. 6 is a diagram for describing a reset operation. In FIGS. 5 and 6, an arrow indicates a current direction. A solid arrow indicates a current direction in a memory cell MC including a thermoelectrically cooled selecting element 130, and a dotted arrow indicates a current direction in a memory cell MC including a thermoelectrically heated selecting element 130.

Before describing operations of the memory device in accordance with the implementations, suppose that the variable resistance element 140 of the memory cell MC includes a transition metal oxide material of which a resistance state changes depending on whether a conductive filament is generated therein or removed therefrom according to the behavior of oxygen vacancies, and unselected cells UNSEL1 to UNSEL3 excluding a selected cell SEL have the same resistance value. Furthermore, suppose that the switching element 133 in the selecting element 130 is a MIT element.

The set operation may be performed so that the variable resistance element 140 changes from a high-resistance state to a low-resistance state, and the reset operation may be performed so that the variable resistance element 140 is changed from the low-resistance state to the high-resistance state.

Referring to FIGS. 1 to 5, the set operation of the memory device in accordance with the implementation will be described. During the set operation, a direction of a current passing through the selected cell SEL among the plurality of memory cells MC, a direction of a current passing through a first unselected cell UNSEL1 sharing a first line 110-1 with the selected cell SEL, and a direction of a current passing through a second unselected cell UNSEL2 sharing a second line 120-1 with the selected cell SEL may be set to the same direction, e.g., a first current direction. On the other hand, a direction of a current passing through a third unselected cell UNSEL3 which does not share the first and second lines 110-1 and 120-1 with the selected cell SEL may be set to a second current direction which is opposite to the first current direction, i.e., the direction of the current passing through the selected cell SEL.

According to the first current direction, as shown in FIG. 5, a higher voltage, e.g., a fourth driving voltage (3V), may be applied to the first line 110-1 to which the selected cell SEL and the first unselected cells UNSEL1 are coupled, and lower voltages having a lower level than the higher voltage, e.g., first and third driving voltages (0V and 2V), may applied to the second lines 120-1 and 120-2 to which the selected cell SEL and the first unselected cells UNSEL1 are coupled, respectively. In addition, a higher voltage, e.g., a second driving voltage (1V), may be applied to the first lines 110-2 to which the second unselected cells UNSEL2 are coupled, and a lower voltage having a lower level than the higher voltage, e.g., the first driving voltage (0V), may applied to the second line 120-1 to which the second unselected cells UNSEL2 are coupled. As a result, it is possible to thermoelectrically cool the selecting elements 130 in the selected cell SEL and the first and second unselected cells UNSEL1 and UNSEL2 since a first voltage is applied to a corresponding first line while a second voltage, which is lower than the first voltage, is applied to a corresponding second line for each of the selected cell SEL and the first and second unselected cells UNSEL1 and UNSEL2.

Similarly, according to the second current direction, a lower voltage, e.g., the second driving voltage (1V), may be applied to the first lines 110-2 coupled to the third unselected cells UNSEL3, and a higher voltage having a higher level than the lower voltage, e.g., the third driving voltage (2V), may be applied to the second lines 120-2 coupled to the third unselected cells UNSEL3, thereby thermoelectrically heating the selecting elements 130 in the third unselected cells UNSEL3.

More specifically, the first driver 20 may drive the first line 110-1 coupled to the selected cell SEL and the first unselected cells UNSEL1 with the fourth driving voltage received from the voltage generator 40, and drive the first line 110-2 coupled to the second and third unselected cells UNSEL2 and UNSEL3 with the second driving voltage received from the voltage generator 40. The second driver 30 may drive the second line 120-1 coupled to the selected cell SEL and the second unselected cells UNSEL2 with the first driving voltage received from the voltage generator 40, and drive the second line 120-2 coupled to the first and third unselected cells UNSEL1 and UNSEL3 with the third driving voltage received from the voltage generator 40. Since the first driving voltage is a ground voltage and the second and third driving voltages have magnitudes corresponding to ⅓ and ⅔ of a magnitude of the fourth driving voltage, currents passing through the selected cell SEL and the first and second unselected cells UNSEL1 and UNSEL2 may have the first current direction, and a current passing through the third unselected cells UNSEL3 may have the second current direction.

Off-state resistance values of the selecting elements 130 in the first and second unselected cells UNSEL1 and UNSEL2 positioned on a sneak current path with respect to the selected cell SEL may be increased by thermoelectric cooling. Since the entire resistance value of the sneak current path may be increased by the first and second unselected cells UNSEL1 and UNSEL2 including the thermoelectrically-cooled selected elements 130, the occurrence of a sneak current during the set operation may be substantially prevented.

On the other hand, an off-state resistance value (or off-current) of the selecting element 130 of the third unselected cell UNSEL3 may be decreased (or increased) by thermoelectric heating. However, due to the non-linear current-voltage characteristic of the switching element 133, the change in a resistance value of the switching element 133 in an off state by thermoelectric cooling may be larger than the change in a resistance value by thermoelectric heating, and the off current of the selecting element 130 may be affected by a larger resistance value. Thus, although the selecting element 130 of the third unselected cell UNSEL3 is thermoelectrically heated, the influence of the off current of the selecting element 130 of the third unselected cell UNSEL3 is small. As a result, the occurrence of the sneak current can be substantially prevented.

Next, referring to FIGS. 1 to 4 and 6, the reset operation of the memory device in accordance with the implementation will be described. During the reset operation, a direction of a current passing through the selected cell SEL among the plurality of memory cells MC, a direction of a current passing through a first unselected cell UNSEL1 sharing a first line 110-1 with the selected cell SEL, and a direction of a current passing through a second unselected cell UNSEL2 sharing a second line 120-1 with the selected cell SEL may be set to the same current direction, e.g., the second current direction, and a direction of a current passing through a third unselected cell UNSEL3 which does not share the first and second lines 110-1 and 120-1 with the selected cell SEL may be set to the first current direction which is opposite to the second current direction, i.e., the direction of the current passing through the selected cell SEL. Thus, during the reset operation, the selected cell SEL, the first unselected cell UNSEL1, and the second unselected cell UNSEL2 may include thermoelectrically heated selecting elements 130, and the third unselected cell UNSEL3 may include a thermoelectrically cooled selecting element 130.

More specifically, the first driver 20 may drive the first line 110-1 coupled to the selected cell SEL and the first unselected cells UNSEL1 with the first driving voltage received from the voltage generator 40, and drive the first line 110-2 coupled to the second and third unselected cells UNSEL2 and UNSEL3 with the third driving voltage received from the voltage generator 40. The second driver 30 may drive the second line 120-1 coupled to the selected cell SEL and the second unselected cells UNSEL2 with the fourth driving voltage received from the voltage generator 40, and drive the second line 120-2 coupled to the first and third unselected cells UNSEL1 and UNSEL3 with the second driving voltage received from the voltage generator 40. Since the first driving voltage is the ground voltage and the second and third driving voltages have magnitudes corresponding to ⅓ and ⅔ of the magnitude of the fourth driving voltage, the currents passing through the selected cell SEL and the first and second unselected cells UNSEL1 and UNSEL2 may have the second current direction, and the current passing through the third unselected cell UNSEL3 may have the first current direction.

The off-state resistance value of the selecting element 130 of the third unselected cell UNSEL3 positioned on a sneak current path with respect to the selected cell SEL may be increased by thermoelectric cooling, and thus the entire resistance value of the sneak current path may be increased by the third unselected cell UNSEL3 including the thermoelectrically cooled selecting element 130. As a result, it is possible to substantially prevent the occurrence of a sneak current during the reset operation. Although the selecting elements 130 of the first and second unselected cells UNSEL1 and UNSEL2 are thermoelectrically heated during the reset operation, which is similar to the selection element 130 of the third unselected cell UNSEL3 during the set operation, the influence of the off current of the selecting element 130 of the first and second unselected cells UNSEL1 and UNSEL2 is small. Therefore, the occurrence of a sneak current can be substantially prevented.

It is typically known that, a variable resistance element requires a driving voltage during the reset operation that is larger than a driving voltage during the set operation. For example, during the reset operation, a conductive filament, which has been generated in the variable resistance element by oxygen vacancies during the set operation, needs to be removed. Thus, the driving voltage required during the reset operation has a larger magnitude than the driving voltage required during the set operation. As such, the balance (or symmetry) between the driving voltages required during the set operation and the reset operation may be broken in a memory device including variable resistance elements.

However, the memory device in accordance with the implementation may reduce the magnitude of the driving voltage required during the reset operation since the selecting element is thermoelectrically heated to lower the activation energy of the variable resistance element. Thus, the memory device including the selecting element may improve the balance between the driving voltages required during the set operation and the reset operation.

In accordance with the implementations, the selecting element in which the switching element and the thermoelectric element are coupled to each other may be provided to reduce the off current of the selecting element, thereby substantially preventing the occurrence of the sneak current in the cell array having the cross-point architecture. Furthermore, it is possible to improve the balance (or symmetry) between biases applied to the variable resistance element during the set operation and the reset operation.

Furthermore, the memory device may use driving voltages corresponding to $\frac{1}{3}$ and $\frac{2}{3}$ of the maximum driving voltage to drive lines coupled to unselected cells, thereby more effectively preventing the occurrence of the sneak current.

The semiconductor memory in accordance with the implementation of the present disclosure may be applied to diverse electronic devices or systems. FIGS. 7 to 11 show some examples of electronic devices or systems that can implement the semiconductor memory disclosed herein.

Figure 7:
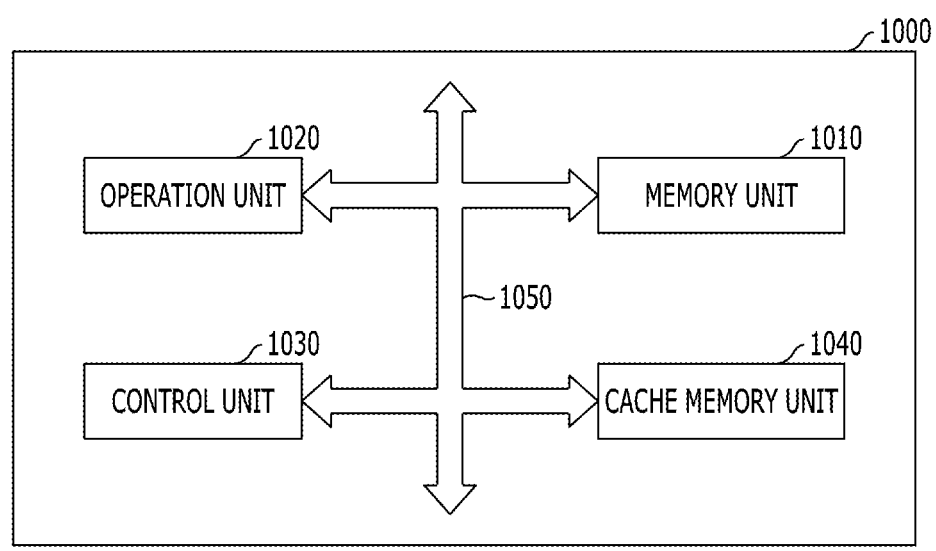
FIG. 7 is a configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
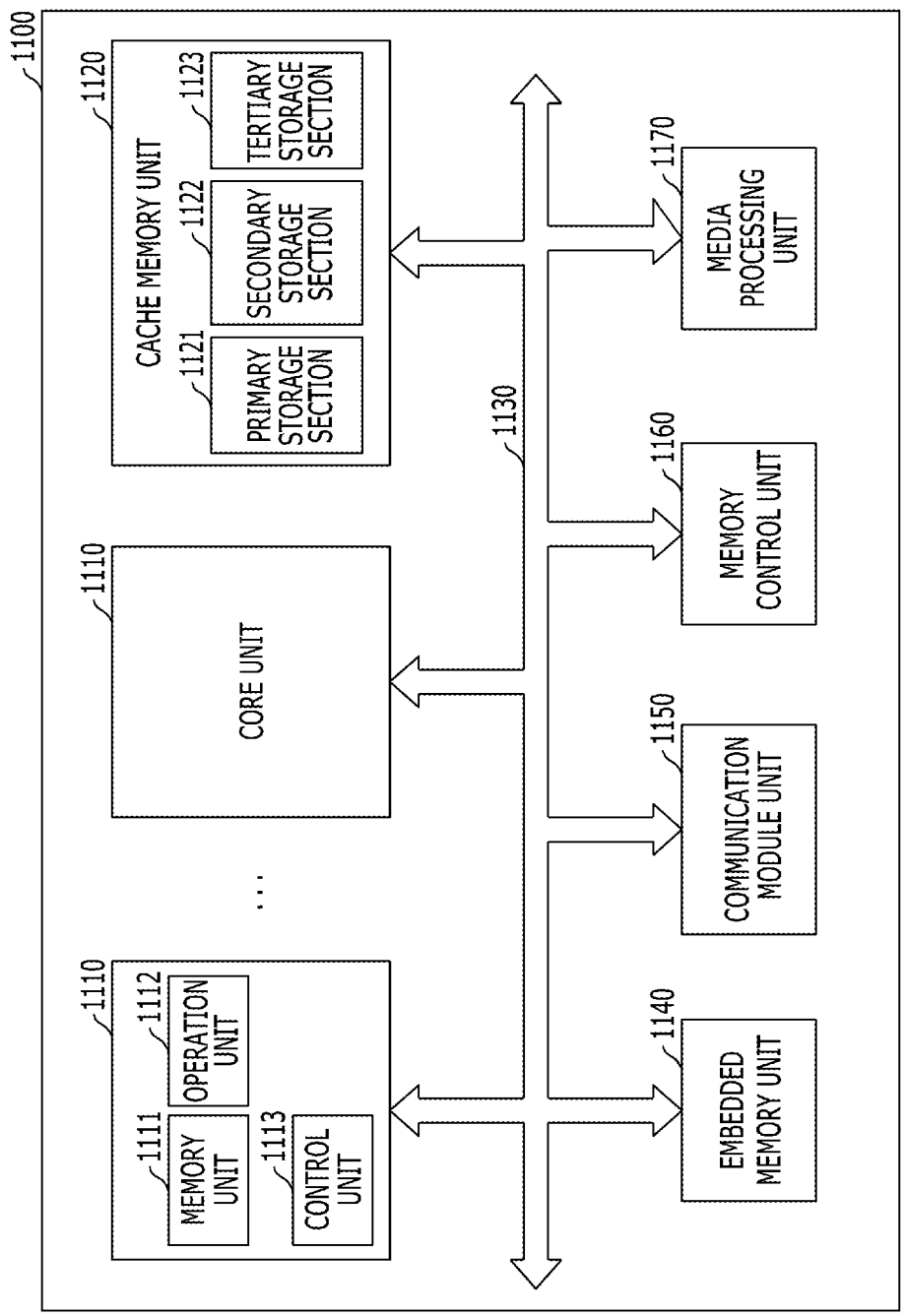
FIG. 8 is a configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the cache memory unit 1120 and the processor 1100 may have improved reliability.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
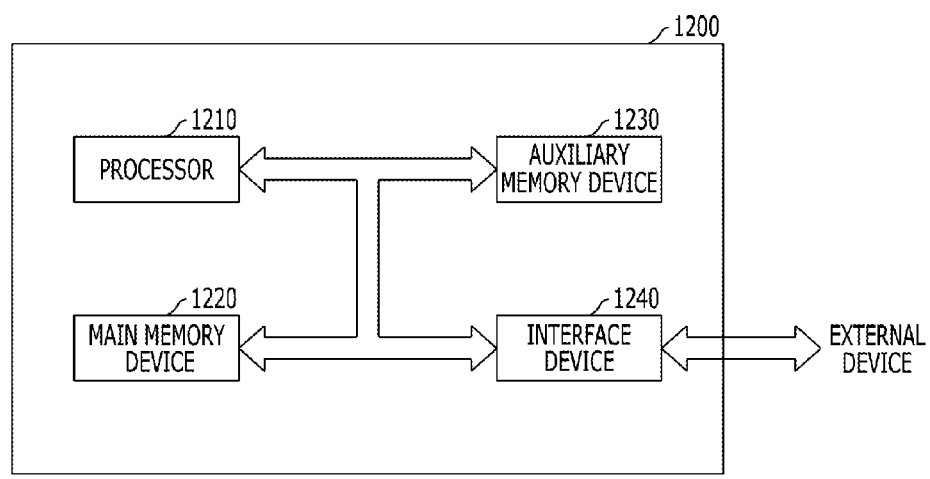
FIG. 9 is a configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the auxiliary memory device 1230 and the system 1200 may have improved reliability.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
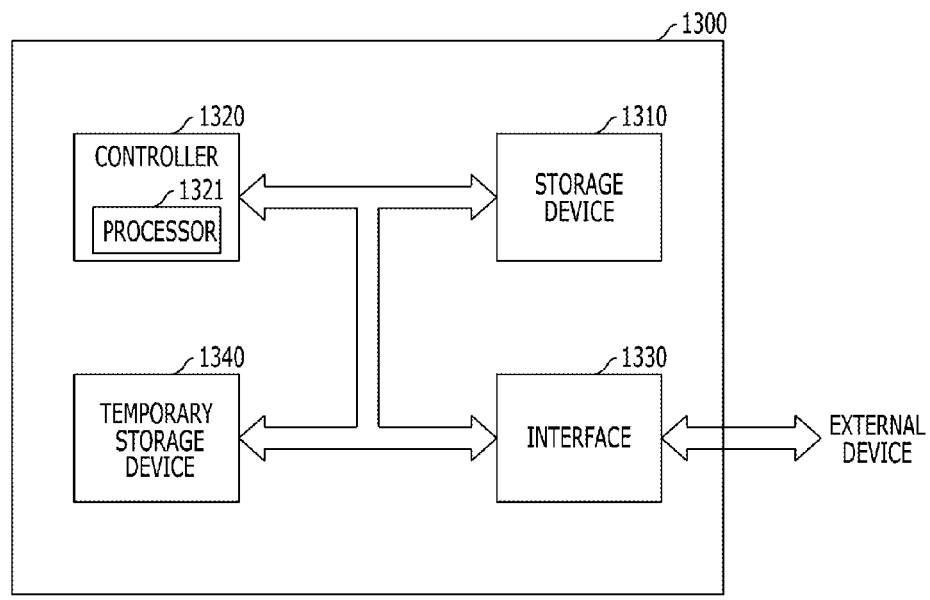
FIG. 10 is a configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the temporary storage device 1340 and the data storage system 1300 may have improved reliability.

Figure 11:
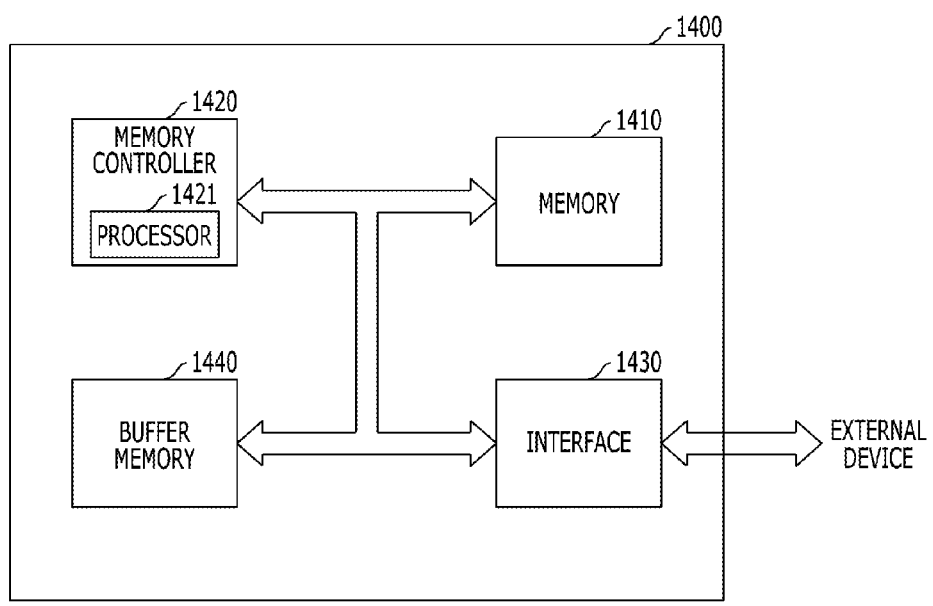
FIG. 11 is a configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a plurality of first lines extended in one direction and arranged in parallel to each other, a plurality of second lines extended intersecting the plurality of first lines, and arranged in parallel to each other, and a plurality of memory cells arranged at the respective intersections between the plurality of first lines and the plurality of second lines. Each of the memory cells may include a selecting element in which a switching element having a non-linear current-voltage characteristic and a thermoelectric element are coupled to each other, a variable resistance element coupled to the selecting element, and an heat insulating member surrounding at least the selecting element. The selecting element in which the switching element and the thermoelectric element are coupled to each other may be provided to reduce the off current of the selecting current, thereby preventing the occurrence of a sneak current in the cell array having a cross-point architecture. That is, it is possible to improve the operating characteristics and reliability of the device by providing the above-described selecting element. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7 to 11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a plurality of first lines extending in a first direction and arranged in parallel to each other;
    a plurality of second lines extending in a second direction crossing the plurality of first lines and arranged in parallel to each other; and
    a plurality of memory cells disposed in intersection regions of the plurality of first lines and the plurality of second lines, respectively,
    wherein each of the memory cells comprises:
    a selecting element including a switching element and a thermoelectric element that are coupled to each other, the switching element having a non-linear current-voltage characteristic;
    a variable resistance element coupled to the selecting element; and
    a heat insulating member surrounding at least a sidewall of the selecting element.

2. The electronic device of claim 1, wherein the switching element comprises one selected from a MIT (Metal Insulator Transition) element, a MIEC (Mixed Ion-Electron Conducting) element, an OTS (Ovonic Threshold Switching) element, and a combination thereof.

3. The electronic device of claim 1, wherein the thermoelectric element comprises:
    a first material layer coupled to one terminal of the switching element and having a first work function; and
    a second material layer coupled to the other terminal of the switching element and having a second work function smaller than the first work function.

4. The electronic device of claim 3, wherein the first and second material layers have complementary conductive types.

5. The electronic device of claim 3, wherein the first work function has a value corresponding to a work function of P-type polysilicon, and the second work function has a value corresponding to a work function of N-type polysilicon.

6. The electronic device of claim 3, wherein the first and second material layers comprise a semiconductor material or a metallic material.

7. The electronic device of claim 1, wherein the heat insulating member comprises a material having an insulating property.

8. The electronic device of claim 1, wherein the heat insulating member comprises one selected from a porous material, aerogel, zeolite, Low temp oxide, and a combination thereof.

9. The electronic device of claim 1, wherein the variable resistance element comprises one selected from a ferromagnetic material, a metal oxide material, a phase-change material, a ferrodielectric material, and a combination thereof.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

13. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

14. The electronic device according to claim 1, further comprising a memory system which includes:
    a memory configured to store data and conserve stored data regardless of power supply;
    a memory controller configured to control input and output of data to and from the memory according to a command inputted form an outside;
    a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *